United States Patent
Vichr et al.

[11] Patent Number: 5,443,032
[45] Date of Patent: Aug. 22, 1995

[54] METHOD FOR THE MANUFACTURE OF LARGE SINGLE CRYSTALS

[75] Inventors: Miroslav Vichr, Emmaus; David S. Hoover, New Tripoli, both of Pa.

[73] Assignee: Air Products and Chemicals, Inc., Allentown, Pa.

[21] Appl. No.: 895,482

[22] Filed: Jun. 8, 1992

[51] Int. Cl.[6] .............................................. C30B 25/06
[52] U.S. Cl. ...................................... 117/84; 117/929; 423/446
[58] Field of Search ....... 156/612, 613, 614, DIG. 68; 443/446; 117/84, 929

[56] References Cited

U.S. PATENT DOCUMENTS

| | | | |
|---|---|---|---|
| 4,740,263 | 4/1988 | Imai et al. | 156/614 |
| 4,958,592 | 9/1990 | Anthony et al. | 156/614 |
| 4,997,636 | 3/1991 | Prins | 156/DIG. 68 |
| 5,023,068 | 6/1991 | Jones | 156/DIG. 68 |
| 5,082,522 | 1/1992 | Pardes et al. | 156/612 |
| 5,102,498 | 4/1992 | Itoh et al. | 156/DIG. 68 |
| 5,110,579 | 5/1992 | Anthony et al. | 156/DIG. 68 |
| 5,127,983 | 7/1992 | Imai et al. | 423/446 |
| 5,154,945 | 10/1992 | Baldwin et al. | 423/446 |
| 5,183,529 | 2/1993 | Potter et al. | 156/DIG. 68 |
| 5,209,812 | 5/1993 | Wu et al. | 156/DIG. 68 |
| 5,264,071 | 11/1993 | Anthony et al. | 156/DIG. 68 |

OTHER PUBLICATIONS

J. B. Posthill, R. A. Rudder, G. C. Hudson, D. P. Malta, G. C. Fountain, R. E. Thomas, R. I. Markunas, T. P. Humphreys, R. J. Nemanich, Proceedings of the Second International Symposium on Diamond Materials, Proceedings vol. 91-8 of the Electrochemical Society, May 5-10, (1991), Washington, D.C., p. 274.

G. S. Gildenblat, S. A. Grot and A. R. Badzian, The Electrical Properties and Device Applications of Homoepitaxial and Polycrystalline Diamond Films (IEEE)(1991).

J. L. Davidson, C. Ellis, and R. Ramesham, J. Electron Mat., vol. 18, p. 711 (1989).

S. A. Grot, G. W. Hatfield, G. S. Gildenblat, A. R. Badzian and T. Badzian, The Electrical Properties of Selectively Grown Homoepitaxial Diamond Films, Appl. Phys. Lett., vol. 58, pp. 1542-1544 (1991).

R. Ramesham, T. Roppel, B. F. Hajek, C. Ellis, B. H. Loo "Selective Growth of Boron-Doped Polycrystalline Diamond Thin Films", Proceed. Second Int. Conf. on New Diamond Science and Technology, Washington, D.C. Sep. 23-27, (1990).

H. Yagyu, J. S. Ma, H. Kawarada, T. Yonehara, A. Hiraki, Proceedings of the Second International Symposium on Diamond Materials, Proceedings vol. 91-8 of the Electrochemical Society, May 5-10, 1991, Washington, D.C., p. 274.

A. R. Badzian, T. Badzian and L. Pullione, "Superhard Materials and Superhard Coatings", Int. J. Refractory Metals and Hard Materials, vol. 9, pp. 92-95 (1990).

"Synthetic Diamond-Sumicrystal-Heat Sink for Laser (List continued on next page.)

*Primary Examiner*—R. Bruce Breneman
*Assistant Examiner*—Felisa Garrett
*Attorney, Agent, or Firm*—Keith D. Gourley

[57] ABSTRACT

A method is disclosed for producing large single crystals. In one embodiment, a single crystal of electronic grade diamond is produced having a thickness of approximately 100–1000 microns and an area of substantially greater than 1 cm.$^2$. and having a high crystalline perfection which can be used in electronic, optical, mechanical and other applications. A single crystalline diamond layer is first deposited onto a master seed crystal and the resulting diamond layers can be separated from the seed crystal by physical, mechanical and chemical means. The original master seed can be restored by epitaxial growth for repetitive use as seed crystal in subsequent operations. Large master single crystal diamond seed can be generated by a combination of oriented smaller seed crystals by lateral epitaxial fusion. Since there is no limit to how many times seed combination step can be repeated, large diamond freestanding wafers comparable in size to silicon wafers can be manufactured.

24 Claims, 4 Drawing Sheets

OTHER PUBLICATIONS and Microwave Diodes", Sumitomo Electric Industries, Ltd.

N. W. Geis and H. I. Smith, Proceedings of the Second International Symposium on Diamond Materials, 179th Meeting of the Electrochemical Society in Washington, D.C., May 5–10, 1991, pp. 605–607.

R. P. Zingg, J. A. Friedrich, G. W. Neudeck, B. Hofflinger, IEEE Trans. Electron Devices 37, 1452 (1990).

P. J. Schubert, G. W. Neudeck, IEEE Electron Device Lett. 11, 181 (1990).

D. Pribat, M. Dupuy, P. Legagneux, C. Collet, Appl. Phys. Lett. 57, 375 (1990).

R. A. Rudder, J. B. Posthill, G. C. Hudson, D. Malta, R. E. Thomas, R. J. Markunas, T. P. Humphreys, R. J. Nemanich, Proceedings of the Second International Conference New Diamond Science and Technology, Washington, D.C., Sep. 23–27, 1990, p. 425.

METHOD FOR THE MANUFACTURE OF LARGE SINGLE CRYSTALS

FIELD OF THE INVENTION

This invention relates to the manufacture of large single crystals of diamond, cubic boron nitride, silicon carbide and similar crystals which are difficult to manufacture in large dimensions. More particularly, the invention relates to a chemical vapor deposition (CVD) method for producing single crystal, electronic grade diamond wafers larger than single crystal diamond wafers that are currently available, i.e. areas greater than about 1 cm$^2$.

BACKGROUND OF THE INVENTION

Single crystal diamond wafers are available to the electronics industry in sizes of about 1 cm$^2$ at commercially unattractive prices. There is a need in the electronics industry for diamond semiconductors because of their superior electronic properties in comparison to silicon and other currently used semiconductor materials. Single crystal diamond wafers of sizes up to about 1 cm$^2$ are commercially available and are produced by a high temperature, high pressure process; see a sales brochure entitled "*Synthetic Diamond—Sumictystal-Heat Sink for Laser and Microwave Diode*", Sumitomo Electric Industries, Ltd. Severe technical difficulties associated with scaling up the crystal growing reactors have restricted the size of such diamond wafers.

Single crystal diamond wafers have not heretofore been available by other approaches such as chemical vapor deposition (CVD). However, there are reactivated CVD techniques which have been described in the prior art for approaching the goal of single crystal diamond wafers.

One technique describes the production of what is reported to be large area mosaic diamond films consisting of approximately 100 μm single diamond crystals disoriented randomly to within a few degrees of a silicon (Si) substrate crystallographical axis. Such mosaic diamond films are said to approach the quality of single diamond crystals; see N. W. Geis and H. I. Smith, *Proceedings of the Second International Symposium on Diamond Materials*, 179th Meeting of the Electrochemical Society in Washington, D.C., May 5–10, 1991, pages 605–607. In this technique, commercially available (111)-faceted diamond seeds having diameters of 75 to 100 μm are deposited on (100)-oriented Si substrates which had been patterned and etched using standard photolithographic methods to form 90 μm square etch pits on 100 μm centers faceted on (111)-planes. Homoepitaxial diamond is grown on the diamond seeds to form a continuous diamond film composed of a plurality of approximately oriented small crystals.

The disadvantages of such a technique over that of the method of the present invention are that default holes occur in the resulting film as a result of missing seed crystals in some of the etch pits and that a slight misorientation occurs among the individual single crystal grains. Therefore, this prior art technique did not produce large single crystals.

In silicon microelectronics, selected area silicon growth processes have been used to fabricate sophisticated three-dimensional devices; see R. P. Zingg, J. A. Friedrich, G. W. Neudeck, B. Hofflinger, *IEEE Trans. Electron Devices* 37, 1452 (1990) and P. J. Schubert, G. W. Neudeck, *IEEE Electron Device Lett.* 11, 181 (1990).

In gallium arsenide microelectronics, selected-area growth has been found to localize substrate defects to the area of epitaxial growth above the original seed holes of the masking layer. Few defects are observed to propagate into the epitaxial lateral overgrowth; see D. Pribat, M. Dupuy, P. Legagneux, C. Collet, *Appl. Phys. Lett.* 57, 75 (1990).

In the emerging diamond technology, similar results were found by R. A. Rudder et al, who succeeded to deposit diamond above a photolithographically defined large electronic device area and observed isotropic overgrowth advancing vertically and horizontally by about the same rate; see R. A. Rudder, J. B. Posthill, G. C. Hudson, D. Malta, R. E. Thomas, R. J. Markunas, T. P. Humphreys, R. J. Nemanich, *Proceedings of the Second International Conference New Diamond Science and Technology*, Washington, D.C., Sep. 23–27, 1990, page 425. The quality of homoepitaxially grown diamond above the holes in the masking layer on the device was claimed to be superior to the quality of underlying diamond substrate; see J. B. Posthill, R. A. Rudder, G. C. Hudson, D. P. Malta, G. C. Fountain, R. E. Thomas, R. J. Markunas, T. P. Humphreys, R. J. Nemanich, *Proceedings of the Second International Symposium on Diamond Materials*, Proceedings Volume 91-8 of the Electrochemical Society, May 5–10, 1991, Washington, D.C., page 274; G. S. Gildenblat, S. A. Grot and A. R. Badzian, *The Electrical Properties and Device Applications of Homoepitaxial and Polycrystalline Diamond Films*, IEEE (1991); J. L. Davidson, C. Ellis, and R. Ramesham, *J. Electron. Mat.*, Vol. 18, page 711 (1989); S. A. Grot, C. W. Hatfield, G. S. Gildenblat, A. R. Badzian and T. Badzian, *The Electrical Properties of Selectively Grown Homoepitaxial Diamond Films*, Appl. Phys. Lett., Vol. 58, pages 1542–1544 (1991); and R. Ramesham, T. Roppel, B. F. Hajek, C. Ellis, B. H. Loo, "*Selective Growth of Boron-Doped Polycrystalline Diamond Thin Films*", Proceed. Second Int. Conf. on New Diamond Science and Technology, Washington D.C. Sep. 23–27, 1990.

The superior quality of a laterally propagated epitaxial layer is believed to be due to the so called "necking effect", which is frequently used in Bridgman or Czochralski crystal growth. Necking down the growing crystal limits the propagation of dislocation frown the seed crystal only to the straight direction of growth, but not in lateral directions. In the references mentioned above, R. A. Rudder and J. B. Posthill have demonstrated that the same effect of lateral overgrowth, which is being used successfully in silicon and gallium arsenide microelectronics for the fabrication of three dimensional integrated circuits, will allow for the fabrication of three dimensional integrated circuits in diamond microelectronics technology. There is no suggestion in these references to use this technology to grow large monocrystalline diamond plates.

Another technique called SENTAXY, originally used in silicon technology, was utilized by H. Yagyu et al. This technique was used to generate diamond polycrystalline growth consisting of a regular array of relatively large diamond single crystal (10μ) randomly or preferentially crystallographically oriented in relation to the silicon surface. A polycrystalline array of diamonds was grown by a microwave-assisted chemical vapor deposition technique; see H. Yagyu, J. S. Ma, H. Kawarada, T. Yonehara, A. Hiraki, *Proceedings of the Second International Symposium on Diamond Materials*, Proceedings Volume 91-8 of the Electrochemical Society, May 5–10, 1991, Washington, D.C., page 274. This technique can be used to elucidate nucleation and crystal growth of diamond, because the technique enables one to grow crystals separately and to control nucleation sites artificially thereby facilitating the study of diamond nucleation sites on the substrate. The technique also enables the studying of initial growth of CVD diamond ex-situ by increasing the size of the same particle by repetitive successive growth and observing the same via a scanning electron microscope (SEM). However, this reference makes no suggestion of manufacturing large diamond single crystals.

Single crystal diamond films having very small surface areas that are comparable to that of natural diamond crystals, have been grown on natural and high temperature/high pressure diamond substrates; see A. R. Badzian, T. Badzian and L. Pullione, "Superhard Materials and Superhard Coatings", *Int. J. Refractory Metals and Hard Materials,* Vol. 9, pages 92–95 (1990). Several problems were noted as being unsolved in connection with the growing of such crystals; see the G. S. Gildenblat et al reference referred to above. One of the specific problems mentioned in this paper was that of depositing diamond via CVD onto non-diamond substrates to produce larger heteroepitaxial films, which were reported to be vital to electronic applications. The method of the present invention overcomes the overall problem referred to in this paper because Applicants' method enables one to produce large single crystal diamonds, i.e. having areas of greater than 1 cm$^2$, which materials are vital to the electronics industry.

SUMMARY OF THE INVENTION

In contrast to the techniques disclosed in the prior art, the method of the present invention solves the problem of generating large single crystals with high crystalline perfection which can be used in electronic, optical, mechanical and other applications.

According to the initial steps of this method, a plurality of substrate surfaces or seed wafers are oriented to form a seed plate which is patterned with a plurality of holes spaced apart to form a masking layer on the seed plate. The patterned seed plate is placed into a crystal growing reactor and epitaxial crystals are grown through the seed holes and then over the masking layer to form a continuous layer of monocrystalline material over the entire surface of the masking layer for a period of time to achieve a thickness in the range of about 1 $\mu$m to about 3,000 $\mu$m. In the case of freestanding crystal wafers, a thickness in the range of about 100 $\mu$m to about 2,000 $\mu$m is preferred.

The resultant fully grown epitaxial crystal is separated from the seed plate by physical, mechanical or chemical means. For example, the masking layer is etched or burned out and then the pillars of crystal between the seed plate and the epitaxially grown crystal are cleaved or eliminated by mechanical, physical, cutting or chemical means. The single crystal recovered from this process has an area that is greater than each of the plurality of seed wafers that comprise the seed plate.

After the initial steps of the method have been carried out, the resulting single crystal can then be used as the seed plate in place of the plurality of smaller seed wafers used in the initial steps of the method and the remaining step of crystal growing, separation and recovery are repeated.

BRIEF DESCRIPTION OF THE DRAWINGS

Further features and advantages of the method disclosed herein will become apparent from the following and more particular description of the preferred embodiment of the invention as illustrated in the accompanying drawings, in which.

DETAILED DESCRIPTION OF THE INVENTION

Figure 1:
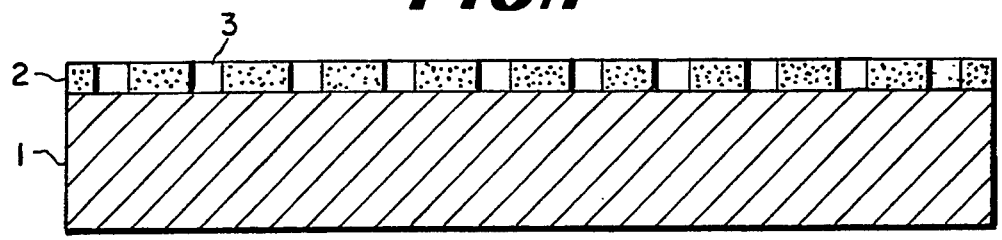
FIG. 1 illustrates a substrate having a masking layer which is patterned with a plurality of evenly distributed holes.

As shown in FIG. 1, substrate 1 is shown with masking layer 2 which is patterned with a plurality of evenly distributed holes 3 made by standard photolithographical procedures. Suitable masking layer materials can include any material which is chemically compatible with the substrate such as metals, glassy materials, polymers, ceramics and pyrolyzed organic compounds. Specific examples of such materials include, but are not limited to the following: silicon, tungsten, molybdenum, nickel, gold, copper, soft carbon, carbon soot, diamond-like carbon, hydrogenated diamond-like carbon, graphite, $SiO_2$, SiC, $Si_3N_4$, MgO, CaO, polycarbonate, polypropylene, polyethylene, and photoresist compounds.

Figure 2:
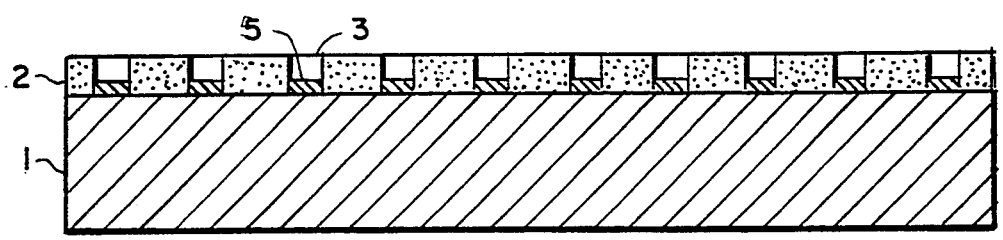
FIG. 2 illustrates the substrate according to FIG. 1 wherein epitaxial diamond has been deposited within the holes of the masking layer.
Figure 3:
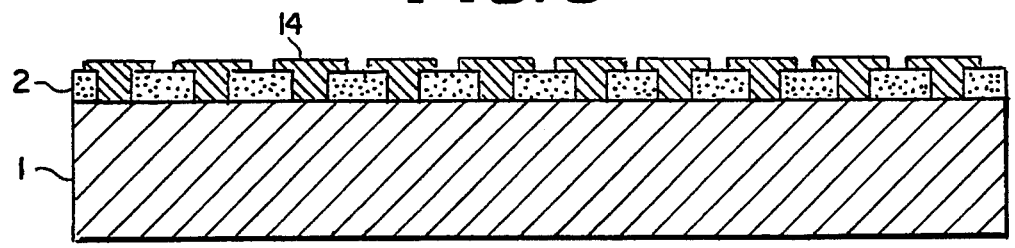
FIG. 3 illustrates the substrate according to FIG. 2 wherein epitaxial diamond has grown laterally and vertically out of the holes of the masking layer.
Figure 2A:
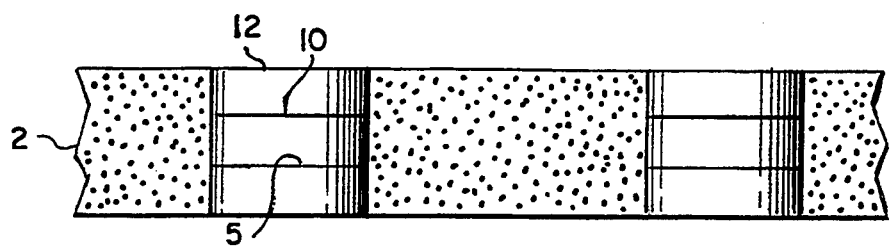
FIG. 2A is an enlargement of one of the holes in the masking layer during the initial period of diamond crystal growth shown in FIG. 2.
Figure 3A:
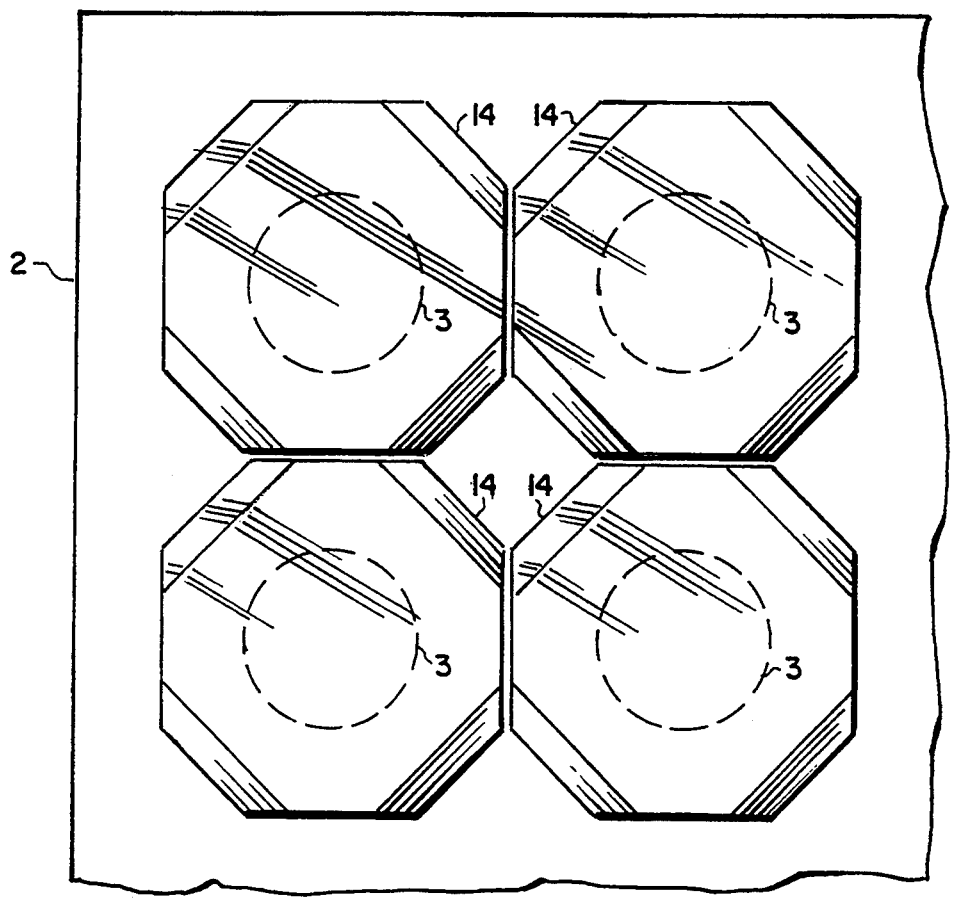
FIG. 3A is a top plan view of one corner of the masked seed plate 1, as schematically illustrated in FIG. 3, showing the regular diamond crystal growth with octagonal cross-section before the crystals become fused into a single crystal.
Figure 3B:
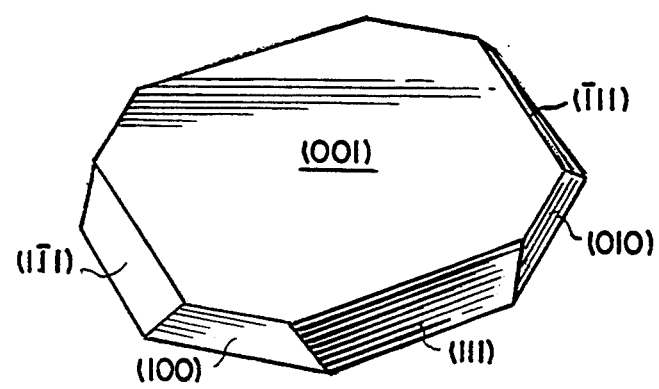
FIG. 3B is an oblique pictorial view of an individual diamond nucleus that forms above the holes of the masked layer as schematically illustrated in FIG. 3.

The patterned substrate is placed into a suitable crystal growing reactor. During approximately the first hour of growth, an initial level 5 of epitaxial diamond layer is reached within the confines of hole 3, as shown in FIG. 2. During a period of 30 minutes to 1 hour of the growth process, depending on the specific geometries involved, the epitaxial diamond layers within holes 3 increase from level 5 through levels 10 to level 12 shown in FIG. 2A. As the growth process continues, the epitaxial diamond crystal 14 laterally and vertically grows out of holes 3 and begins to over-spread the surface of masking layer 2 as shown in FIGS. 3, 3A and 3B. Specifically, in the case of diamond growth through holes 3 of a masking layer 2 comprising $SiO_2$ on (100) diamond substrate, one of the individual diamond crystals is illustrated by FIG. 3B in which each of the facets is identified. FIG. 3B shows that the individual crystals are limited by (100) and (111) crystallographical faces of high perfection during the first several hours of growth.

Figure 4:
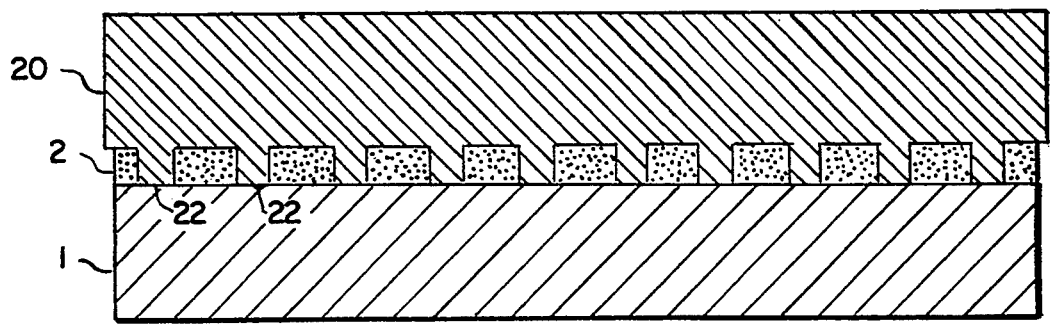
FIG. 4 illustrates the substrate according to FIG. 3 wherein the diamond nuclei growing through the holes of the masking layer have coalesced into a single crystal diamond layer.
Figure 5:
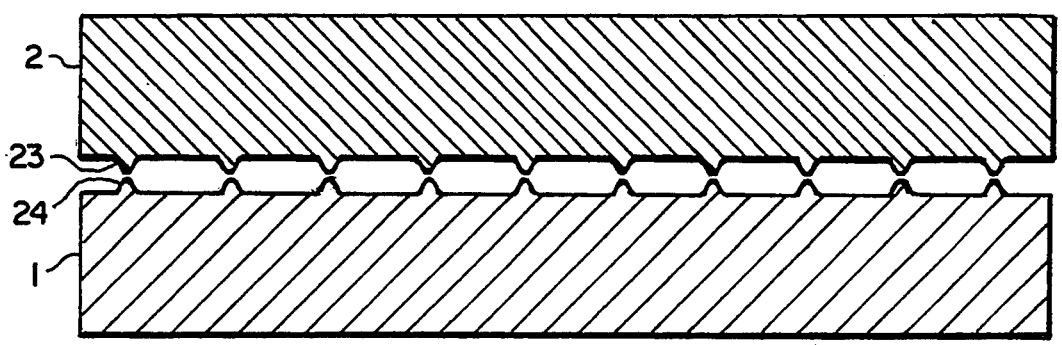
FIG. 5 illustrates the structure according to FIG. 4 wherein pillars are etched through to form an epitaxial diamond containing upper protrusions and a seed plate containing lower protrusions.
Figure 6:
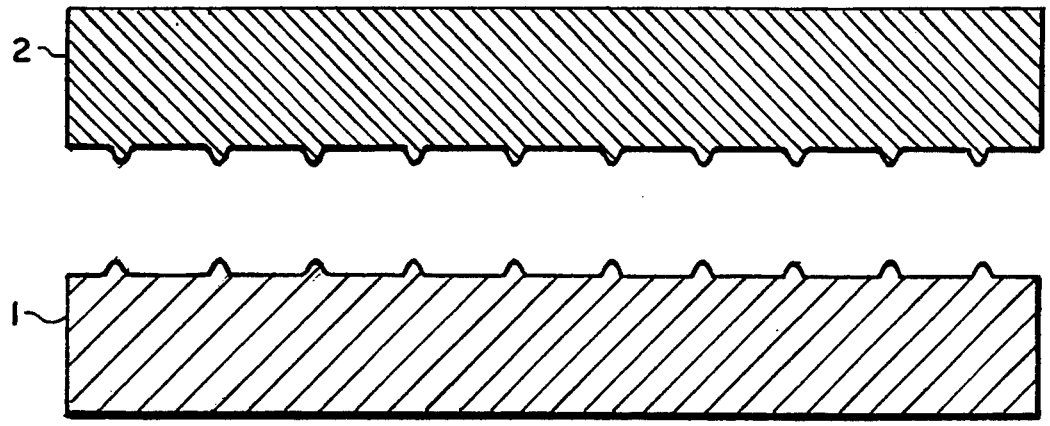
FIG. 6 illustrates the structure according to FIG. 5 wherein the upper and lower protrusions are removed by mechanical or chemical means to form a free-standing epitaxial diamond crystal.

After the small diamond nuclei growing through holes 3 coalesce into a single crystal diamond layer 20 and the diamond layer reaches desired thickness for the application (2 microns to 1 mm, or more), as shown in FIG. 4, the growth 30 process is stopped and single crystal diamond layer 20 is separated from the diamond seed plate 1 into a freestanding diamond wafer by mechanical, chemical, or other means. For example, separation can be accomplished by etching, laser cutting, cleaving, thermal shock in a temperature gradient, mechanical forces induced by different thermal expansion of the masking layer and diamond and other similar methods. In the case of a $SiO_2$ masking layer, the entire composite structure illustrated in FIG. 4 is immersed in an etching bath such as hydrofluoric acid to leave diamond crystal pillars 22 which occupy the space of holes 3. As shown in FIG. 5, pillars 22 are etched through to form crystal 20 containing the upper protrusions 23 and the original seed plate 1 containing the lower protrusions 24. As shown in FIG. 6, upper and lower protrusions 23 and 24, that remain after the etching of pillars 22, are removed by mechanical or chemical means. For example, crystal 20 and seed plate 1 can be heated in an air atmosphere at 750° C. to etch away the upper and lower protrusions.

Figure 7:
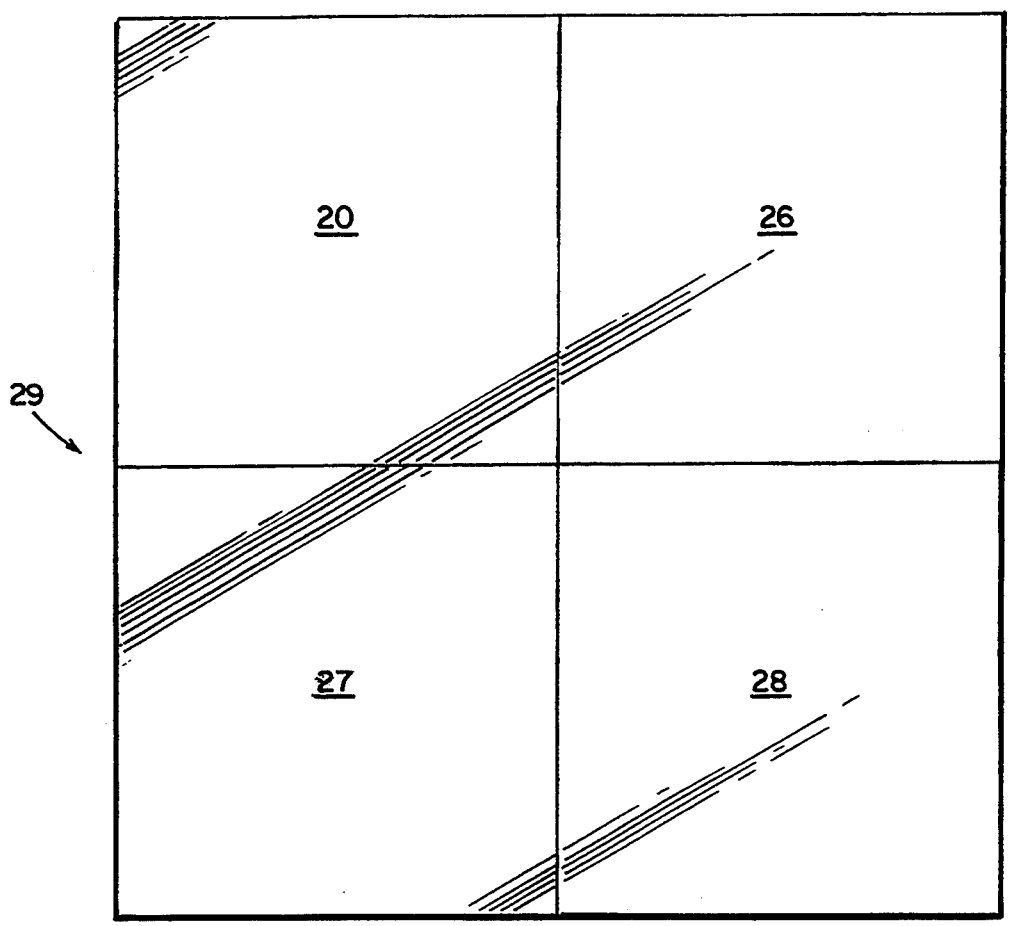
FIGS. 7–8 are schematic illustrations (not to scale) of two of the essential steps in the fabrication of a large single diamond crystal according to the method of the present invention.
Figure 8:
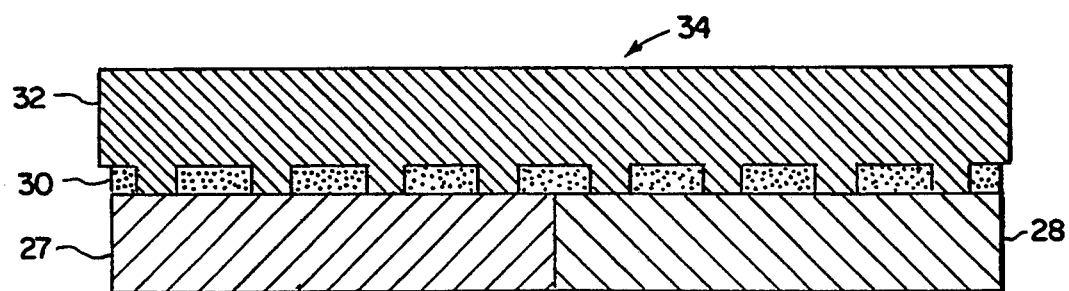

The original diamond seed plates will be reused in a new cycle of the same process for manufacturing another diamond single-crystalline freestanding wafer. Large diamond seed wafers are generated by precise alignment of several small crystallographically oriented diamond seed wafers to form larger seed plates and subsequent diamond growth through holes in the mask until the desired size of diamond free-standing wafer is achieved. Methods for achieving precise alignment of the seed wafers are well known in the art. FIG. 7 illustrates the assembly of four of these single diamond crystals, 20, 26, 27 and 28, to form square seed plate 29. However, the exact number of separate seed wafers that are operably positioned to form the seed plate comprising the plurality of seed wafers is not critical and will depend on the particular size of the final crystal product. Masking layer on seed plate 29 as shown in FIG. 8 is patterned masked by photolithographic procedures in the same manner as the individual seed wafers and seed plate 29 containing the patterned masking layer 30 is placed in a crystal growing reactor to grow large epitaxial diamond crystal 32 on seed plate 29 to form composite 34. Crystal 32 can grow to sufficient thickness to be freestanding or to a thin crystal epitaxial layer which can be mounted in a supporting package or frame or as a layer in a composite material. Such a package or frame for the thin crystal can be of any suitable metal, ceramic or plastic. For ease of separating thin crystal layer 32 from seed plate 29, a layer of copper or other suitable material can be deposited over the surface of the layer 32.

In one embodiment in which the masking layer comprises soft carbon, soot, pyrolyzed polymers and similar carbonaceous materials, the epitaxially grown crystal layer is separated from the seed plate by etching the masking layer at temperatures in the range of about 250° to about 600° C. in the presence of an oxygen-containing atmosphere and raising the temperature in the range of about 600° to about 900° C. to etch away the diamond pillars in an oxidizing atmosphere.

The commercially important feature of the present invention is that after the large, epitaxially grown crystal layer is separated from said seed plate, the resulting separated large crystal is used in the production of additional single crystals. Once an inventory has been manufactured of seed plates of varying lengths and widths ranging in area from about 2 to about 20 cm.$^2$, the large area seed plates are patterned masked and placed directly into the crystal growing reactor for replication of single crystals of substantially the same area.

The method of the present invention produces large crystals using small crystal starting materials, i.e. the seed plate, such as natural and high pressure/high temperature synthetic diamond crystals which are available in sizes up to about 1 cm.$^2$. This is also applicable to other technically important crystals which are available only in small crystal sizes which can be used as the seed crystals for the present method. Such materials include silicon carbide and cubic boron nitride and similar crystals which are difficult to manufacture in large dimensions.

Diamond growth for the purpose of this invention can be accomplished by any technique capable of growing diamond epitaxial layers, which is not detrimental to the masking layer. The exact crystal growing techniques that are used to grow the large crystals by the present method are not critical. The following list of techniques is illustrative, but not exhaustive: Hot filament CVD (HFCVD), microwave-assisted CVD, radio frequency plasma CVD (RFCVD), DC plasma assisted CVD, electron assisted CVD, Electron Cyclotron Resonance (ECR) plasma CVD, DC or AC arc plasma jet, and combustion flame diamond growth deposition. The following references provide an illustration of the state of the art of such techniques: U.S. Pat. Nos. 4,767,608; 4,740,263; 4,734,339 and 4,707,384.

One of the most frequently used chemical compounds for diamond growth is methane (0.1–7% vol.) with hydrogen gas making up the balance. Methane can be replaced with a variety of other compounds containing carbon, hydrogen, halogen, and sometimes oxygen. The following hydrocarbons have been successfully used: methane, ethane, propane, acetylene, ethene and benzene. The use of organic compounds such as methyl alcohol, ethyl alcohol, acetone, acetic acid results typically in faster diamond growth rates. Halogens or halocarbons based mixtures with hydrocarbons or alcohols and small oxygen addition allow growth of diamond crystal at lower temperatures. A carbon monoxide mixture (e.g. 15% by volume) with hydrogen is also known to result in good quality diamond growth. Oxygen and water are sometimes added to carbon-containing mixtures in order to modify character of crystal growth. Inert gases are also sometimes added to reaction mixture.

The purity of gases is critical for electronic applications in respect to species that become incorporated in the diamond crystal and are either electrically active or result in formation of inclusions. An example of such undesirable impurity is nitrogen. On the other hand, electrically active impurities are sometimes deliberately added in order to render the diamond crystal electrically conductive. Examples of such impurities added to growth atmosphere are diborane or some other boron compounds, which make diamond a p-type conductor.

The temperature of diamond substrate during the growth can be chosen from 350° C. to 1100° C. The preferred temperature range for HFCVD with 1% methane and 99% hydrogen is 600°–1050° C. at 30 torr pressure in the reactor. The gas mixture pressure depends on the particular technique used. Typical pressure for the HFCVD technique is between 20–40 torr. The range of gas pressure is from low pressures, i.e. 0.5 torr which is sometimes used in RFCVD, to 1 atm. in the DC arc jet technique. The flow rate of the gas mixture depends on specific crystal growing technique used and the size of the crystal growing reactor. Gas flow rates for a 5 cm diameter HFCVD reactor range frown 1 $cm^3$/min. to 100 $cm^3$/min., preferably in the range 5 $cm^3$/min. to 15 $cm^3$/min.

The masking layer can be deposited on diamond seed by a number of techniques routinely used in semiconductor industry such as evaporation, sputtering, CVD and the like. The material chosen for the masking layer should be compatible with diamond and the crystal growing process at crystal growth temperatures. It is preferable to choose material for the masking layer which after the deposition is very smooth or amorphous, because smooth or amorphous surfaces slow down parasitic diamond nucleation thereon. This allows for diamond nuclei growing on diamond substrate through patterned holes to coalesce into a continuous single crystal diamond crystal epitaxial layer before parasitic nuclei on the surface of masking layer reach significant dimensions. Small randomly oriented parasitic spontaneously nucleated diamond nuclei get engulfed under the growing diamond epitaxial layer and do not interfere with the epitaxial diamond layer itself.

Patterning of the masking layer can be done by standard photolithographical techniques routinely used in semiconductor industry for device manufacturing. A photolithographical mask is designed which allows for printing a design on photoresist, spinned off on masking layer on the top of diamond seed. The design consists of circles or squares or other geometrical figures with dimensions from 0.1 $\mu$m–4 $\mu$m separated by distance of 0.5–20.0 $\mu$m on rectangular, hexagonal or other grit pattern. After developing the exposed photoresist, holes are etched in masking layer. The thickness of masking layer determines the depth of etched holes. The thickness of masking layer can be from 0.01 $\mu$m to 5$\mu$m with preferred range from 0.1 $\mu$m 2 $\mu$m. The surface of the masking layer can also be rendered amorphous by ion bombardment, i.e. with argon ions. This treatment further inhibits undesirable spontaneous diamond nucleation on the surface of masking layer.

In the preferred embodiment of the present invention, HFCVD and microwave-assisted CVD reactors have been used to manufacture large single diamond crystals. A general description of the type of HFCVD reactors and the process conditions suitable for depositing such diamond crystals via HFCVD are set forth in patent application, Ser. No. 578,637, filed by the assignee of the present invention on 6 Sep. 1990, the pertinent portions of which are incorporated by reference herein. A general description of the type of microwave-assisted CVD reactors and the process conditions suitable for depositing such diamond crystals via microwave-assisted CVD are set forth in A. R. Badziam. T. Badzian, R. Roy, R. Messier, K. E. Spear, "*Crystallization of Diamond Crystals and Films By Microwave-Assisted CVD [II]*", Mat. Res. Bulletin, Vol. 23, pages 531–548 (1988), the pertinent portions of which are incorporated by reference herein.

The examples which follow illustrate the method of the invention and the single crystal diamond wafers having large areas that are produced thereby.

EXAMPLE 1

A natural II.A type diamond single crystal square substrate of (100) orientation and 1 mm×1 mm×0.25 mm dimensions was used as a seed plate for crystal growth. The diamond seed plate was cleaned with organic solvents by rinsing for 2 min. in trichloroethane, 2 min. in acetone, 2 min. in ethyl alcohol and 5 min. in deionized water, and blown dry with nitrogen gas. Next, the wafer was placed in an ion beam sputtering machine in order to deposit on its polished surface, 0.5 $\mu$m of silicon dioxide. After evacuating to a pressure of $5 \times 10^{-6}$ torr, the diamond substrate was precleaned with an argon ion beam generated from an 11 cm diameter Kaufman source at 500 eV and 137 mA for 1 min.

Following the precleaning step, 0.5 $\mu$m of silicon dioxide was deposited from a silicon dioxide source bombarded with an argon ion beam generated from a 5 cm diameter Kaufman source at 1000 cV and 100 mA at $1 \times 10^{-4}$ torr pressure. The deposition rate of silicon dioxide was 100 A/min. This 0.5 $\mu$m silicon dioxide layer was used as a masking layer in which 2 $\mu$m diameter holes on 4 $\mu$m centers on a rectangular grid were opened by the following photolithographical procedure. After spinning the positive photoresist at 5,000 rpm for 20 sec. and a 90° C. bake, the photoresist layer on the top of the substrate was exposed in the mask alligner with the appropriate mask for 20 sec. and developed for 40 sec. in developer. This step opened the holes in photoresist. Holes in the silicon dioxide masking layer were etched by buffered hydrofluoric acid until the diamond surface was reached. Photoresist stripper at 70° C. for 10 min. was used to remove the remainder of the photoresist, followed by a three times repeated rinse procedure of acetone, methanol and deionized water.

The resulting patterned diamond substrate was dried in an oven at 120° C. for 15 min. and was then placed on a wafer holder in an HFCVD reactor for diamond epitaxial growth. The details of the HFCVD reactor used in this example are described in U.S. Ser. No. 578,734 referred to above. After the distance between carburized tantalum filament and patterned diamond seed plate had been adjusted to about 10 mm, the HFCVD reactor was evacuated three times and was refilled with helium. Hydrogen (99.999% purity) was then admitted into the reactor at a flow rate of 20 sccm/min. and the pressure was adjusted to 30 torr. The temperature of the patterned diamond substrate was raised to 850° C. at a rate of 100° C./min. A fraction of the molecular hydrogen was decomposed by the hot filament into atomic hydrogen which etches the diamond surface. This caused the elimination of any polishing damage on the surface of the diamond substrate and provided for hydrogen termination of the diamond surface. After the annealing in a hydrogen atmosphere had been carried out for 20 min., diamond epitaxial growth on the diamond substrate was initiated at 850° C. using a 30 torr mixture of 1% methane and 99% hydrogen at the same 20 sccm/min. flow rate used for annealing. The temperature of the hot filament was maintained at about 2300° C. throughout the hydrogen anneal step and the diamond epitaxial growth. Epitaxial growth of diamond was carried out for 48 hours at a diamond growth rate of about 0.83 µm/hour. At the termination of growth cycle, helium gas was admitted to the HFCVD reactor at 30 torr and a flow rate of 10 sccm/min. The resulting diamond crystal on the diamond substrate composite was cooled at a rate of 100° C./min. to room temperature. The increase in the thickness of patterned diamond substrate was measured to be 40 which was due to the newly grown diamond epitaxial layer above the silicon dioxide patterned masking layer.

After the termination of the crystal growth cycle, the composite is immersed in buffered hydrofluoric acid for a sufficient period of time to dissolve the silicon dioxide masking layer with the help of ultrasonic agitation. The newly grown 40 µm thick diamond epitaxial layer is then separated from the diamond substrate by etching in an oxidizing atmosphere. Specifically, the composite is subjected to air at 750° C. for a sufficient period of time to etch the 2 µm diamond pillars connecting the newly grown single crystal diamond layer with the original diamond substrate until separation occurs.

EXAMPLE 2

A natural 2.A type diamond single crystal square substrate of (100) orientation and 1 mm×1 mm×0.25 mm dimensions was used as a seed plate for crystal growth. The diamond seed plate was cleaned with organic solvents by rinsing for 2 min. in trichloroethane, 2 min. in acetone, 2 min. in ethyl alcohol and 5 min. in deionized water, and blown dry with nitrogen gas. Next, the wafer was placed in an ion beam sputtering machine in order to deposit on its polished surface 0.5 µm of silicon dioxide. After pump down to $5 \times 10^{-6}$ torr, the diamond substrate was precleaned with an ion beam generated from 11 cm diameter Kaufman source at 500 eV and 137 mA for 1 min.

Following the preclean, 0.5 µm of silicon dioxide was deposited from a silicon dioxide source bombarded with an argon ion beam generated from a 5 cm diameter Kaufman source at 1000 eV and 100 mA at $1 \times 10^{-4}$ torr pressure. The deposition rate of silicon dioxide was 100 A/min. This 0.5 µm silicon dioxide layer was used as a masking layer in which 24 µm diameter holes on 4 µm centers on a rectangular grit were opened by the following photolithographical procedure. After spinning the positive photoresist at 5,000 rpm for 20 sec. and a 90° bake, the photoresist layer on the top of the substrate was exposed in the mask alligner with the appropriate mask for 20 sec. and developed for 40 sec. in developer. This step opened the holes in the photoresist and the openings in the silicon dioxide were etched by buffered hydrofluoric acid until the diamond surface was reached. Photoresist stripper at 70° C. for 10 min. was used to remove the remainder of the photoresist, followed by a three step rinse procedure of acetone, methanol and deionized water.

The patterned diamond substrate was dried in an oven at 120° C. for 15 min. and was placed on a wafer holder in a microwave plasma assisted chemical vapor deposition reactor for diamond epitaxial growth as described in an article by A. R. Badzian, T. Badzian, R. Roy, R. Messier, K. E. Spear in Materials Research Bulletin, Vol. 23, p.p. 531–548, 1988. After evacuation of the microwave plasma assisted chemical vapor deposition reactor, 30 torr of 99.999%, pure hydrogen was admitted to the reactor at a flow rate of 100 sccm/min. and the temperature of the diamond substrate was raised to 880° C. in 10 min. This hydrogen treatment cleaned, etched and conditioned the surface of the diamond substrate for subsequent epitaxial growth which was performed during the following 30 min. in the 30 torr atmosphere of a mixture of 2 volume % of methane in 98 volume % of hydrogen at the flow of 100 sccm. After this initial nucleation and growth period the concentration of methane was decreased to 1 volume % in 99 volume % hydrogen at 30 torr and a flow rate of 100 sccm/min. Temperature was kept constant at 880° C. during 12 hours. After this 12 hour period of epitaxial growth the diamond substrate was cooled to room temperature in the same mixture of gases during 20 min. The reactor was then evacuated and air atmosphere admitted to the reactor. When the thickness of the sample was measured, an increase of 12 µm was observed, which corresponded to approximately 1 µm/hour diamond epitaxial growth rate.

After terminating the crystal growth cycle, the silicon dioxide masking layer is dissolved in buffered hydrofluoric acid with the help of ultrasonic agitation. The newly grown 12 µm thick diamond epitaxial layer is separated from the diamond substrate by etching away in air at 750° C., the 2 micron diamond pillars connecting the newly grown single crystal diamond layer with original diamond substrate.

EXAMPLE 3

A 0.5 µm thick layer of silicon dioxide is deposited by sputtering on four 1 cm² single-crystal diamond seed plates of (100) orientation in the manner set forth under Example 1. Next, 0.5 µm round holes located in a rectangular grid with 2 µm centers are opened by a photolithographic technique with a suitable mask in the silicon dioxide layer until the diamond surface is reached. Four 1 cm² patterned diamond single crystal wafer of (100) orientation are precisely aligned in the reactor wafer holder by methods known in the art to form seed plate 29 as indicated in FIGS. 7 and 8. The same HFCVD technique used in Example 1 is used to grow the epitaxial layer. The epitaxial growth of diamond is carried out until the thickness of a new diamond layer above the masking layer reaches the desired thickness of 500 µm. After termination of the crystal growth cycle, the SiO₂ masking layer is dissolved in hydrofluoric acid with the help of ultrasonic agitation. The newly grown 500 µm thick epitaxial layer is separated from the seed plate by the procedures set forth under Example 1. This epitaxial layer after the termination of the etching step becomes a freestanding monolithic single crystal diamond wafer (20 mm×20 mm×0.5 mm), four times larger than each of the four 1cm² segments that is used as a combined diamond seed plate at the beginning of the process. The original diamond seeds can be repolished and regrown to their original thickness by the same CVD epitaxial process without a masking step before being reused in the next growth cycle.

After generating four 20 mm×20 mm×0.5 mm single crystal diamond wafers, the epitaxial growth process is repeated as described above with the newly generated four diamond seeds. This step again results in a quadrupling of the wafer area to the size of 40 mm×40 mm×0.5 min. The step is then repeated until the final desirable area of freestanding diamond wafer is achieved. Subsequent epitaxial plates are then produced from the large area diamond wafer by the same process.

EXAMPLE 4

A 0.5 μm thick layer of gold is deposited by evaporation on four 1cm² single-crystal diamond seed plates of (111) orientation. Next, 0.5 μm round holes located in a rectangular grid with 2 μm centers are opened in the gold layer by a photolithographic technique with a suitable mask and etched until the diamond surface is reached. Four 1cm² patterned diamond single crystal plates of (111) orientation are precisely aligned in the reactor wafer holder as indicated in FIG. 7 and 8. The hot filament CVD technique is used to grow epitaxial layer. The temperature of the seed crystals is raised to 900° C. in the 30 torr hydrogen atmosphere. A fraction of the molecular hydrogen is decomposed by a hot filament into atomic hydrogen. A hydrogen atmosphere is used to clean, etch and condition the surface of diamond seed plates for 20 minutes before subsequent diamond epitaxial growth at 900° C. in the 30 torr mixture of 1% $CH_4$, and 99% hydrogen. The 2300° C. hot filament is 10 mm distant from the diamond wafers during the process. Epitaxial growth of diamond is carried out until the thickness of the new diamond layer above the masking layer reaches the desirable value of 1000μ. After termination of the crystal growth cycle, the gold masking layer is dissolved in aqua regia with the help of ultrasonic agitation. The newly grown 1000μ thick epitaxial layer is separated from the seed crystals by cleaving. This cleaving step severs the 0.5 μm diameter diamond pillars connecting the original diamond seed with the newly grown diamond epitaxial layer.

This epitaxial layer after the cleaving step becomes a freestanding monolithic single crystal diamond wafer (20 mm×20 mm×1.0 mm), four times larger than each of the four 1cm² segments used as a combined diamond seed at the beginning of the process. Original diamond seeds are then repolished and regrown to their original thickness by the same hot filament CVD epitaxial process without a masking step before being used in the next growth cycle.

After generating four 20 mm×20 mm×1.0 mm single crystal diamond wafers, the epitaxial growth process is repeated as described above with the newly generated four diamond seeds. This step results again in quadrupling of the wafer area to the size of 40 mm×40 mm×1.0 mm. The step is repeated until the desirable area of freestanding diamond wafer is achieved. Subsequent epitaxial plates are then produced from the large area diamond wafer by the same process.

EXAMPLE 5

A 1.0 μm thick layer of positive photoresist is deposited by spinning on four 1 cm² single-crystal diamond seed plates of (100) orientation. Next 0.5 μm round holes located in a rectangular grid with 2 μm centers are opened by a photolithographic technique with a suitable mask in the positive photoresist until the diamond surface is reached. Four 1cm² patterned diamond single crystal plates of (100) orientation are precisely aligned in the reactor wafer holder as indicated in FIG. 7 and 8. The hot filament CVD technique is used to grow epitaxial diamond layer. Photoresist layer is pyrolyzed at 450° C. for 30 min. in 30 torr hydrogen atmosphere. A fraction of the molecular hydrogen is decomposed by a hot filament into atomic hydrogen. Hydrogen atmosphere is used to clean, etch and condition the surface of the diamond for 20 minutes before subsequent diamond epitaxial growth at 680° C. in the 30 torr mixture of 1% $CH_4$ and 99% hydrogen. The 2300° C. hot filament is 10 mm distant from the diamond wafers during the process. Epitaxial growth of diamond is carried out until the thickness of the new diamond layer above the masking layer reaches the desirable value of 300μ. After termination of the crystal growth cycle, carbonized photoresist is oxidized in oxygen at 550° C. The newly grown 300μ thick epitaxial layer is separated from seed crystals by etching away the half micron of diamond in air atmosphere at 750° C. This oxidizing step eliminates the 0.5μ diameter diamond pillars connecting the original diamond seed with the newly grown diamond epitaxial layer.

This epitaxial layer after the termination of the oxidizing step becomes a freestanding monolithic single crystal diamond wafer (20 mm×20 mm×0.3 mm), four times larger than each of the four 1cm² segments used as combined diamond seed at the beginning of the process. Original diamond seeds are then repolished and regrown to their original thickness by the same CVD epitaxial process without masking step before being used in the next growth cycle.

After generating four 20 mm×20 mm×0.3 mm single crystal diamond wafers, the epitaxial growth process is repeated as described above with the newly generated four diamond seeds. This step results again in quadrupling of the wafer area to the size of 40 mm×40 mm×0.5 mm. The step is repeated until the desirable area of freestanding diamond wafer is achieved. Subsequent epitaxial diamond plates are then produced from the large area diamond wafer by the same process.

EXAMPLE 6

A 0.5 μm thick layer of silicon dioxide is deposited by sputtering on four 1 cm² single-crystal diamond seed plates of (111) orientation in the manner set forth under example 1. Next, 0.5 μm round holes located in a rectangular grid with 2 μm centers are opened by a photolithographic technique with a suitable mask in the silicon dioxide layer until the diamond surface is reached. Four 1 cm² patterned diamond single crystal plates of (111) orientation are precisely aligned in the reactor wafer holder to form seed plate 29 as indicated in FIGS. 7 and 8.

The hot filament CVD technique is used to grow epitaxial layer. The temperature of the seed crystals is raised to 900° C. in the 30 torr hydrogen atmosphere. A fraction of the molecular hydrogen is decomposed by hot filament into atomic hydrogen. Hydrogen atmosphere is used to clean, etch and condition the surface of diamond seed plates for 20 minutes before subsequent diamond epitaxial growth at 900° C. in the 30 torr mixture of 1% $CH_4$, and 99% hydrogen. The 2300° C. hot filament is 10 mm distant from the diamond wafers during the process. Epitaxial growth of diamond is carried out until the thickness of new diamond layer above the masking layer reaches the desirable value of 500 μm.

After termination of the crystal growth cycle, silicon dioxide masking layer is dissolved in buffered hydrofluoric acid. Then, the new diamond composite is mounted by soldering on a water chilled copper block. The newly grown diamond layer, 500μ thick, is rapidly heated with an acetylene torch to about 1000° C. Thermal expansion of the newly grown diamond layer causes mechanical stresses in the diamond pillars which severs the 0.5 μm pillars along the (111) easy cleavage plane.

This epitaxial layer after the termination of the separation step becomes a freestanding monolithic single crystal diamond wafer (20 mm×20 mm×0.5 mm), four times larger than each of the four 1 cm² segments used as combined diamond seed at the beginning of the process. Original diamond seeds are then repolished and regrown to their original thickness by the same CVD epitaxial process without masking step before being used in the next growth cycle.

After generating four 20 mm×20 mm×0.5 mm single crystal diamond wafers, the epitaxial growth process is repeated as described above with the newly generated four diamond seeds. This step results again in quadrupling of the wafer area to the size of 40 mm×40 mm×0.5 mm. The step is repeated until the desirable area of freestanding diamond wafer is achieved. Subsequent epitaxial plates are then produced from the large area diamond wafer by the same process.

EXAMPLE 7

Four natural II.A type diamond single crystal square substrates of (100) orientation and 10 mm×10 mm×0.25 mm dimensions are used as seed plates for crystal growth. The diamond seed plates are cleaned with organic solvents by rinsing for 2 min. in trichloroethane, 2 min. in acetone, 2 min. in ethyl alcohol and 5 min. in deionized water, and blown dry with nitrogen gas. Next, the wafers are placed in an ion beam sputtering machine in order to deposit on its polished surface, 0.3 μm of hydrogenated diamond-like carbon and 0.1 μm of silicon dioxide. After evacuating to a pressure of $5 \times 10^{-6}$ torr, the diamond substrates are precleaned with an argon ion beam generated from an 11 cm diameter Kaufman source at 500 eV and 137 mA for 1 min.

Following the precleaning step, 0.3 μm of hydrogenated diamond-like carbon is deposited from a Kaufman 11 cm diameter source operated on methane at ion energy 40 eV and 100 mA current at $8 \times 10^{-5}$ torr. Following the 0.3 μm of hydrogenated diamond-like coating, 0.1 μm of silicon dioxide is deposited from a silicon dioxide source bombarded with Argon ion beam generated from a 5 cm diameter Kaufman source at 1000 eV and 100 mA at $1 \times 10^{-4}$ torr pressure. The deposition rate of silicon dioxide is 100Å/min. This 0.1 μm silicon dioxide layer is used as a masking layer in which 2 μm diameter holes on 4 μm centers on a rectangular grid are opened by the following photolithographical procedure. After spinning the positive photoresist at 5,000 rpm for 20 sec. and 90° C. bake, the photoresist layer on the top of the substrate is exposed in the mask alligner with the appropriate mask for 20 sec. and developed for 40 sec. in developer. This step opens the holes in the photoresist. Holes in the silicon dioxide masking layer are etched by buffered hydrofluoric acid until the hydrogenated diamond-like surface is reached. Photoresist stripper at 70° C. for 10 min. is used to remove the remainder of the photoresist, followed by a three 10 times repeated rinse procedure of acetone, methanol and deionized water.

The resulting patterned diamond substrate is dried in oven at 120° C. for 15 min. and the holes in hydrogenated diamond-like coating are opened by oxygen plasma etch until the surface of diamond is reached.

Four 1 cm² patterned diamond single crystal wafers of (100) orientation are precisely aligned in the reactor wafer holder to form seed plate 29 as indicated in FIGS. 7 and 8. The same microwave plasma assisted CVD technique is used for diamond epitaxial growth in the manner set forth in the example 2.

Epitaxial growth of diamond is carried out for 500 hours at the rate of 1μ/hour. After termination of the crystal growth cycle, hydrogenated diamond-like carbon layer is oxidized in oxygen at 590° C. The newly grown 500μ thick epitaxial layer is separated from seed crystal by etching away 3 μm of diamond in air atmosphere at 750° C. This etching step eliminates the 2 μm diameter diamond pillars connecting original diamond epitaxial layer. The silicon dioxide layer is etched away by hydrofluoric acid and a freestanding diamond single crystal wafer is produced with dimensions about 20 mm×20 mm×0.5 mm.

Various other embodiments and aspects of our invention will occur to those skilled in the art without departing from the spirit or scope of the invention. Having thus described the present invention, what is now deemed appropriate for Letter Patent is set forth in the following appended claims.

We claim:

1. A chemical vapor deposition method for producing a single crystal diamond comprising:
   (a) depositing a masking layer including a plurality of seed holes spaced part in said masking layer onto a seed plate comprising a plurality of oriented single crystal diamond seed wafers;
   (b) placing said seed plate into a chemical vapor deposition reactor;
   (c) growing epitaxial diamond through said seed holes and laterally over the masking layer to form a continuous epitaxially grown single crystal diamond layer over said masking layer;
   (d) separating the resulting epitaxially grown single crystal diamond layer from said seed plate; and
   (e) recovering a single crystal diamond having an area greater then the area of each of the individual seed wafers.

2. The method of claim 1 wherein said single crystal diamond according to step (e) is used as said seed plate in place of the plurality of oriented single crystal diamond seed wafers.

3. The method of claim 2 wherein the thickness of said epitaxially grown diamond layer is in file range of about 1 μm to about 3000 μm.

4. The method of claim 2 wherein the thickness of said epitaxially grown diamond layer is in the range of about 1001 μm to about 2000 μm.

5. The method of claim 1 wherein said epitaxially grown diamond layer is chemical vapor deposited at temperatures in the range of about 250° to about 1100° C.

6. The method of claim 1 wherein said epitaxially grown diamond layer is chemical vapor deposited in a hot filament chemical vapor deposition reactor.

7. The method of claim 6 wherein said epitaxially grown crystal layer is chemical vapor deposited at temperatures in the range of about 600° to about 1050° C.

8. The method of claim 1 wherein said epitaxially grown crystal layer is chemical vapor deposited in a microwave-assisted chemical vapor deposition reactor.

9. The method of claim 1 wherein said epitaxially grown crystal layer is chemical vapor deposited in a plasma-assisted chemical vapor deposition reactor.

10. The method of claim 1 wherein said epitaxially grown crystal layer is chemical vapor deposited in a radio frequency plasma-assisted chemical vapor deposition reactor.

11. The method of claim 1 wherein said epitaxially grown crystal layer is chemical vapor deposited in an Electron Cyclotron Resonance plasma-assisted chemical vapor deposition reactor.

12. The method of claim 1 wherein said epitaxially grown crystal layer is chemical vapor deposited in a direct current plasma-assisted chemical vapor deposition reactor.

13. The method of claim 1 wherein said epitaxially grown crystal layer is chemical vapor deposited in a direct current arc plasma jet-assisted chemical vapor deposition reactor.

14. The method of claim 1 wherein said epitaxially grown crystal layer is chemical vapor deposited in an alternating current arc plasma jet-assisted chemical vapor deposition reactor.

15. The method of claim 1 wherein said epitaxially grown crystal layer is chemical vapor deposited in an electron assisted chemical vapor deposition reactor.

16. The method of claim 1 wherein said masking layer is selected from the group consisting of silicon, tungsten, molybdenum, nickel, gold, copper, soft carbon, carbon soot, diamond-like carbon, hydrogenated diamond-like carbon, graphite, $SiO_2$, SiC, $Si_3N_4$, CaO, polycarbonate, polypropylene, polyethylene, and photoresist compounds.

17. The method of claim 16 wherein said masking layer is silicon dioxide.

18. The method of claim 1 wherein the epitaxially grown diamond layer is separated from said seed plate by mechanical means.

19. The method of claim 1 wherein the epitaxially grown diamond layer is separated from said seed plate by physical means.

20. The method of claim 19 wherein the epitaxially grown diamond layer is separated from said seed plate by cutting means.

21. The method of claim 20 wherein the epitaxially grown diamond layer is separated from said seed plate by chemical means.

22. The method of claim 21 wherein the epitaxially grown diamond layer is separated from said seed plate by etching a masking layer comprising a carbonaceous material at temperatures in the range of about 250° to about 600° C. in the presence of an oxygen-containing atmosphere and raising the temperature in the range of about 600° to about 900° C. in an oxygen-containing atmosphere.

23. A single crystal, electronic grade freestanding diamond product produced according to claim 1 wherein said epitaxially grown diamond layer has a high crystalline perfection suitable for electronic applications.

24. A single crystal, electronic grade freestanding diamond product produced according to claim 1 wherein said epitaxially grown diamond layer has a crystal orientation of (100).

* * * * *

UNITED STATES PATENT AND TRADEMARK OFFICE
CERTIFICATE OF CORRECTION

PATENT NO. : 5,443,032
DATED : August 22, 1995
INVENTOR(S) : Miroslav Vichr, et al.

It is certified that error appears in the above-identified patent and that said Letters Patent is hereby corrected as shown below:

Column 14, Line 46
    Delete "file" and substitute therefor -- the --

Column 14, Line 50
    Delete "1001" and substitute therefor -- 100 --

Column 15, Line 26
    After $Si_3N_4$, insert -- MgO --

Signed and Sealed this

Eighth Day of October, 1996

Attest:

BRUCE LEHMAN

Attesting Officer      Commissioner of Patents and Trademarks